(12) United States Patent
Morie et al.

(10) Patent No.: US 7,911,369 B2
(45) Date of Patent: Mar. 22, 2011

(54) PIPELINED AD CONVERTER

(75) Inventors: Takashi Morie, Osaka (JP); Kazuo Matsukawa, Osaka (JP); Shiro Sakiyama, Kyoto (JP); Shiro Dosho, Osaka (JP); Yusuke Tokunaga, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/600,784

(22) PCT Filed: Aug. 21, 2008

(86) PCT No.: PCT/JP2008/002268
§ 371 (c)(1),
(2), (4) Date: Nov. 18, 2009

(87) PCT Pub. No.: WO2009/034683
PCT Pub. Date: Mar. 19, 2009

(65) Prior Publication Data
US 2010/0149010 A1    Jun. 17, 2010

(30) Foreign Application Priority Data

Sep. 14, 2007 (JP) .................................. 2007-239020

(51) Int. Cl.
*H03M 1/38* (2006.01)
(52) U.S. Cl. .......................... 341/161; 341/122; 341/162
(58) Field of Classification Search ........... 341/161–162
See application file for complete search history.

(56) References Cited

U.S. PATENT DOCUMENTS

| 4,894,657 | A |   | 1/1990 | Hwang et al. |
| 5,874,912 | A | * | 2/1999 | Hasegawa ...................... 341/161 |
| 6,366,230 | B1 | * | 4/2002 | Zhang et al. .................. 341/162 |

(Continued)

FOREIGN PATENT DOCUMENTS

JP        62-112420        5/1987

(Continued)

OTHER PUBLICATIONS

M. Miyahara et al., "A study on the effect of CMOS scaling in the analog circuit performance—The effect of design rule on CMOS Op-amps and pipeline ADCs," The Institute of Electronics, Information and Communication Engineers, Technical Committee on Integrated Circuits and Devices (ICD), Toyohashi, ICD2005-59, vol. 105, No. 185, pp. 25-30, Jul. 2005.

*Primary Examiner* — Khai M Nguyen
(74) *Attorney, Agent, or Firm* — McDermott Will & Emery LLP

(57) ABSTRACT

A pipelined AD converter (1) includes a plurality of conversion stages (11, 11, . . . ). In each of the conversion stages, an analog-to-digital conversion circuit (101) converts an input voltage (Vin) from the preceding stage to a digital code (Dout). A digital-to-analog conversion circuit (102) converts the digital code obtained by the analog-to-digital conversion circuit to an intermediate voltage (Vda). A charge operation circuit (103) has: a capacitor section (C1, C2) for sampling the input voltage; and an amplifier section (104) for amplifying a mixed voltage of the input voltage sampled by the capacitor section and the intermediate voltage obtained by the digital-to-analog conversion circuit. The amplifier section (104) includes a plurality of op-amps (amp1, amp1, . . . ) having the same configuration and connected in parallel with each other.

19 Claims, 14 Drawing Sheets

U.S. PATENT DOCUMENTS

| | | |
|---|---|---|
| 6,396,429 B2 * | 5/2002 | Singer et al. .................. 341/155 |
| 6,420,991 B1 | 7/2002 | Yu |
| 6,545,628 B1 | 4/2003 | Aram |
| 7,313,380 B2 * | 12/2007 | Yamaji ......................... 455/264 |
| 2004/0125008 A1 | 7/2004 | Yamaji |
| 2005/0190095 A1 | 9/2005 | Wada et al. |

FOREIGN PATENT DOCUMENTS

| | | |
|---|---|---|
| JP | 62-154910 | 7/1987 |
| JP | 2002-223165 | 8/2002 |
| JP | 2004-031407 | 1/2004 |
| JP | 2004-214905 | 7/2004 |
| JP | 2005-244871 | 9/2005 |

* cited by examiner

FIG.13
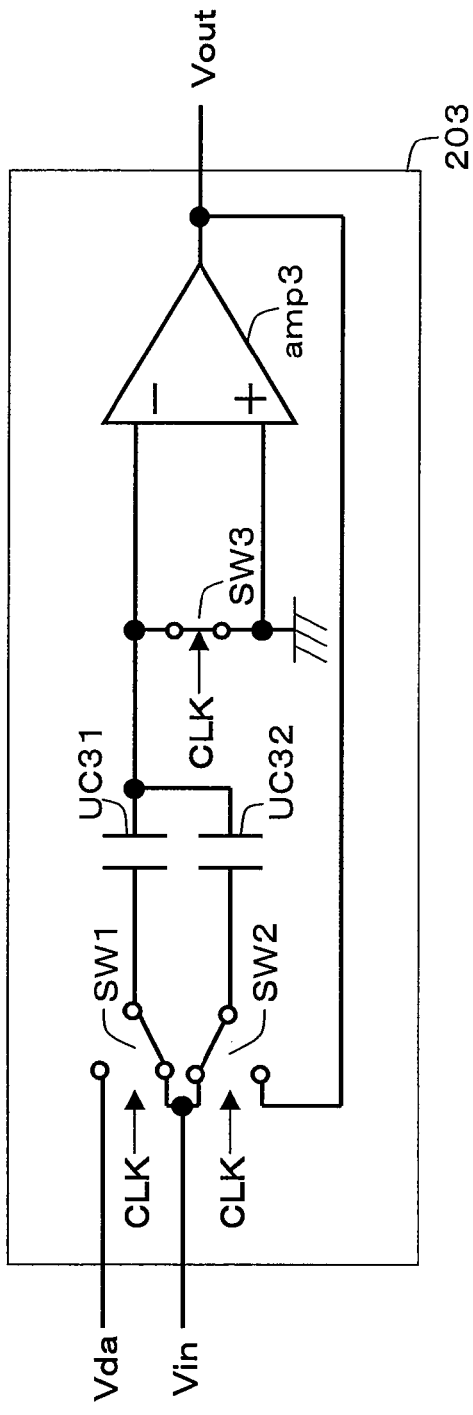
(A)
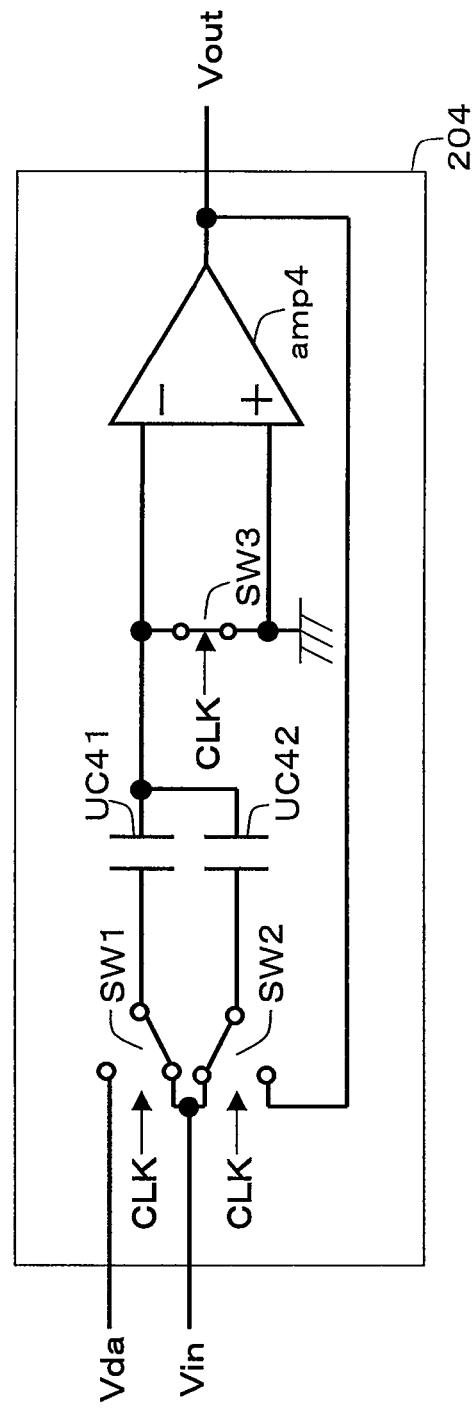
(B)

PIPELINED AD CONVERTER

RELATED APPLICATIONS

This application is the U.S. National Phase under 35 U.S.C. §371 of International Application No. PCT/JP2008/002268, filed on Aug. 21, 2008, which in turn claims the benefit of Japanese Application No. 2007-239020, filed on Sep. 14, 2007, the disclosures of which Applications are incorporated by reference herein.

TECHNICAL FIELD

The present invention relates to a pipelined AD converter.

BACKGROUND ART

In the signal processing field, pipelined AD converters are used. The pipelined AD converter includes a plurality of cascaded conversion stages, and in each of the conversion stages, analog-to-digital conversion and amplification/output of a residual voltage are sequentially executed, to convert an analog signal to a digital signal bit by bit.

In general, in the pipelined AD converter, higher amplification precision is required for a conversion stage closer to the first conversion stage. For example, in a pipelined AD converter for converting an analog input voltage to 10-bit digital data, while the tolerable error (tolerance) for the final (tenth) conversion stage is "($\frac{1}{2}$) times as large as the input voltage," the tolerance for the ninth conversion stage is "($\frac{1}{2}$)$^2$ times as large as the input voltage," and the tolerance for the first conversion stage is "($\frac{1}{2}$)$^{10}$ times as large as the input voltage." That is, the tolerance decreases by ($\frac{1}{2}$) every stage from the final conversion stage toward the first conversion stage. Also, it is preferred to reduce the circuit scale and power consumption of the pipelined AD converter. For these reasons, the individual conversion stages are designed so that the capacitance value of capacitors, the gain of operational amplifiers (op-amps), and the current drive capability of the op-amps decrease in the order from the first conversion stage toward the final conversion stage. With this, the amplification precision becomes higher for a conversion stage closer to the first conversion stage, and the circuit scale and the power consumption become smaller for a conversion stage closer to the final conversion stage. In this way, conventionally, capacitors and op-amps are optimally designed for each conversion stage (see Non-Patent Document 1, for example).

Also, in recent years, analog circuits have been increasingly downsized, and hence it has become difficult to correct an output error in an analog circuit under an analog configuration. For this reason, digital correction techniques have been vigorously developed in which the output error in an analog circuit is determined in advance and digital data is corrected so as to solve the output error (see Patent Document 1, for example).

Non-Patent Document 1: M. Miyahara, T. Kurashina, A. Matsuzawa, "A study on the effect of CMOS scaling in the analog circuit performance—The effect of design rule on CMOS Op-amps and pipeline ADCs," The Institute of Electronics, Information and Communication Engineers, Technical Committee on Integrated Circuits and Devices (ICD), Toyohashi, ICD2005-59, Vol. 105, No. 185, pp. 25-30, July 2005

Patent Document 1: U.S. Pat. No. 6,545,628

DISCLOSURE OF THE INVENTION

Problems to be Solved by the Invention

However, in the conventional pipelined AD converter, the gain and current drive capability of op-amps must be designed for each conversion stage. This makes the layout design difficult and increases the number of man-hours for the layout design.

Also, the gain of op-amps in the individual conversion stages varies with a fabrication error, a temperature change, a fluctuation in power supply voltage, and the like. Hence, to determine an error in digital data, it is necessary to measure the gain errors of op-amps in the individual conversion stages. In the conventional pipelined AD converter, however, in which the gain errors of op-amps must be measured individually for each conversion stage, it takes time and labor to measure the gain errors of op-amps in the individual conversion stages. In particular, in execution of digital correction, it is necessary to first determine the gain errors in the individual conversion stages before measuring the correction amount for the digital data.

Moreover, in the conventional pipelined AD converter, in which the gain differs among the conversion stages, the slope of the input/output characteristic (relationship between the input voltage and the digital output) differs segment by segment. Hence, even when the digital output of the conventional pipelined AD converter is corrected using a digital correction technique, it is difficult to improve the linearity of the input/output characteristic (i.e., to keep the slope of the input/output characteristic uniform), and no improvement in S/N ratio is expected. Accordingly, the conventional pipelined AD converter, which has problems that it takes time to prepare for digital correction and it is difficult to improve the linearity of the input/output characteristic, is not suited to digital correction techniques.

An object of the present invention is to provide a pipelined AD converter in which layout design and measurement of gain errors are easy, and more specifically, to provide a pipelined AD converter suited to digital correction.

Means for Solving the Problems

According to one aspect of the invention, a pipelined AD converter has a plurality of cascaded conversion stages, each of the plurality of conversion stages including: an analog-to-digital conversion circuit for converting an input voltage from the preceding stage to a digital code; a digital-to-analog conversion circuit for converting the digital code obtained by the analog-to-digital conversion circuit to an intermediate voltage; and a charge operation circuit having: a capacitor section for sampling the input voltage; and an amplifier section for amplifying a mixed voltage of the input voltage sampled by the capacitor section and the intermediate voltage obtained by the digital-to-analog conversion circuit, wherein the amplifier section includes a plurality of op-amps having a same configuration and connected in parallel with each other.

In the pipelined AD converter described above, the current drive capability of each of the conversion stages can be adjusted by increasing/decreasing the number of parallel op-amps in the conversion stage. Also, with the op-amps being the same in configuration, the layout can be designed easily, and the number of man-hours for layout design can be reduced, compared with the case of designing op-amps individually for each conversion stage as conventionally done. Moreover, with the gain being the same among the conversion stages, the gain error in each of the conversion stages can be estimated if only the gain error in one conversion stage is known. Hence, the gain error in each of the conversion stages can be easily determined. Furthermore, even when gain errors occur in the conversion stages, the input/output characteristic of the pipelined AD converter has the same slope in all segments although it is discontinuous. It is therefore easy to improve the linearity of the input/output characteristic of the pipelined AD converter with a digital correction technique, and the S/N ratio can be easily improved.

Preferably, in the pipelined AD converter described above, in each of the plurality of conversion stages, as the capacitance value of the capacitor section of the conversion stage is greater, the number of op-amps included in the conversion stage is greater. Preferably, in the pipelined AD converter described above, in each of the plurality of conversion stages, as the conversion stage is closer to the first conversion stage, the capacitance value of the capacitor section of the conversion stage is greater, and the number of op-amps included in the conversion stage is greater.

In the pipelined AD converter described above, the settling error in each of the conversion stages can be reduced, and also the circuit area and power consumption of the entire pipelined AD converter can be reduced.

According to another aspect of the invention, a pipelined AD converter has a plurality of cascaded conversion stages, each of the plurality of conversion stages including: an analog-to-digital conversion circuit for converting an input voltage from the preceding stage to a digital code; a digital-to-analog conversion circuit for converting the digital code obtained by the analog-to-digital conversion circuit to an intermediate voltage; and a plurality of charge operation circuits connected in parallel with each other, each having: a capacitor section for sampling the input voltage; and an op-amp for amplifying a mixed voltage of the input voltage sampled by the capacitor section and the intermediate voltage obtained by the digital-to-analog conversion circuit, wherein the op-amps of the plurality of charge operation circuits have a same configuration, and the capacitor section of each of the plurality of charge operation circuits has a capacitance value corresponding to the current drive capability of the op-amp of the charge operation circuit.

In the pipelined AD converter described above, not only the op-amps but also the capacitor sections are arranged in parallel. Hence, the influence of the capacitor section on the corresponding op-amp can be made roughly uniform among the plurality of conversion stages, and this can reduce a deviation in gain among the conversion stages. Also, with the charge operation circuits being the same in configuration, the layout can be designed further easily compared with the case of arranging only the op-amps in parallel. Moreover, with the gain being the same among the conversion stages even if the number of parallel charge operation circuits is different among the conversion stages, the gain error in each of the conversion stages can be easily determined. Also, it is easy to improve the linearity of the input/output characteristic of the pipelined AD converter, and the S/N ratio can be easily improved.

Preferably, the pipelined AD converter described above further includes a digital correction circuit for correcting digital data including digital codes obtained by the analog-to-digital conversion circuits included in the plurality of conversion stages based on a gain error in at least one conversion stage among the plurality of conversion stages.

In the pipelined AD converter described above, in which digital data is corrected based on the gain error in each of the conversion stages, digital data of an appropriate value can be obtained even if the gain in each of the conversion stages is smaller than a desired value. This eliminates the necessity of designing the op-amps included in each of the conversion stages so that the gain in the first conversion stage becomes a desired value, and hence can suppress the circuit scale and the power consumption from excessively increasing in each of the conversion stages. Moreover, since the gain error in each of the conversion stages can be easily determined, the pipelined AD converter is suited to digital correction techniques.

EFFECT OF THE INVENTION

As described above, since the op-amps have the same configuration, the layout can be designed easily. Also, since the gain is the same among the conversion stages, the gain error in each of the conversion stages can be easily determined. Moreover, it is easy to improve the linearity of the input/output characteristic with digital correction techniques, and the S/N ratio can be easily improved.

BRIEF DESCRIPTION OF THE DRAWINGS

FIGS. 13A and 13B are views showing configurations of charge operation circuits shown in FIG. 12.

| DESCRIPTION OF CHARACTERS | |
|---|---|
| 1, 1a, 2, 2a | Pipelined AD converter |
| 10 | Sample/hold stage |
| 11, 21 | Conversion stage |
| 12 | Digital correction circuit |
| 101 | Analog-to-digital conversion circuit |
| 102 | Digital-to-analog conversion circuit |
| 103 | Sample/hold circuit |
| 104 | Amplifier section |
| 105 | Transfer circuit |
| 201, 203, 204 | Charge operation circuit |
| comp | Comparator |
| sel | Selector |
| SW1, SW2, SW3, SW4, SW5 | Switch |

-continued

DESCRIPTION OF CHARACTERS

| C1, C2, C3, C4, C5 | Capacitor |
| amp1, amp3, amp4 | Op-amp |
| UC1, UC2, UC31, US32, UC41, UC42 | Capacitor |

BEST MODE FOR CARRYING OUT THE INVENTION

Hereinafter, embodiments of the present invention will be described in detail with reference to the relevant drawings. Note that the same or equivalent components throughout the drawings are denoted by the same characters, and description thereof is not repeated.

Embodiment 1

Figure 1:
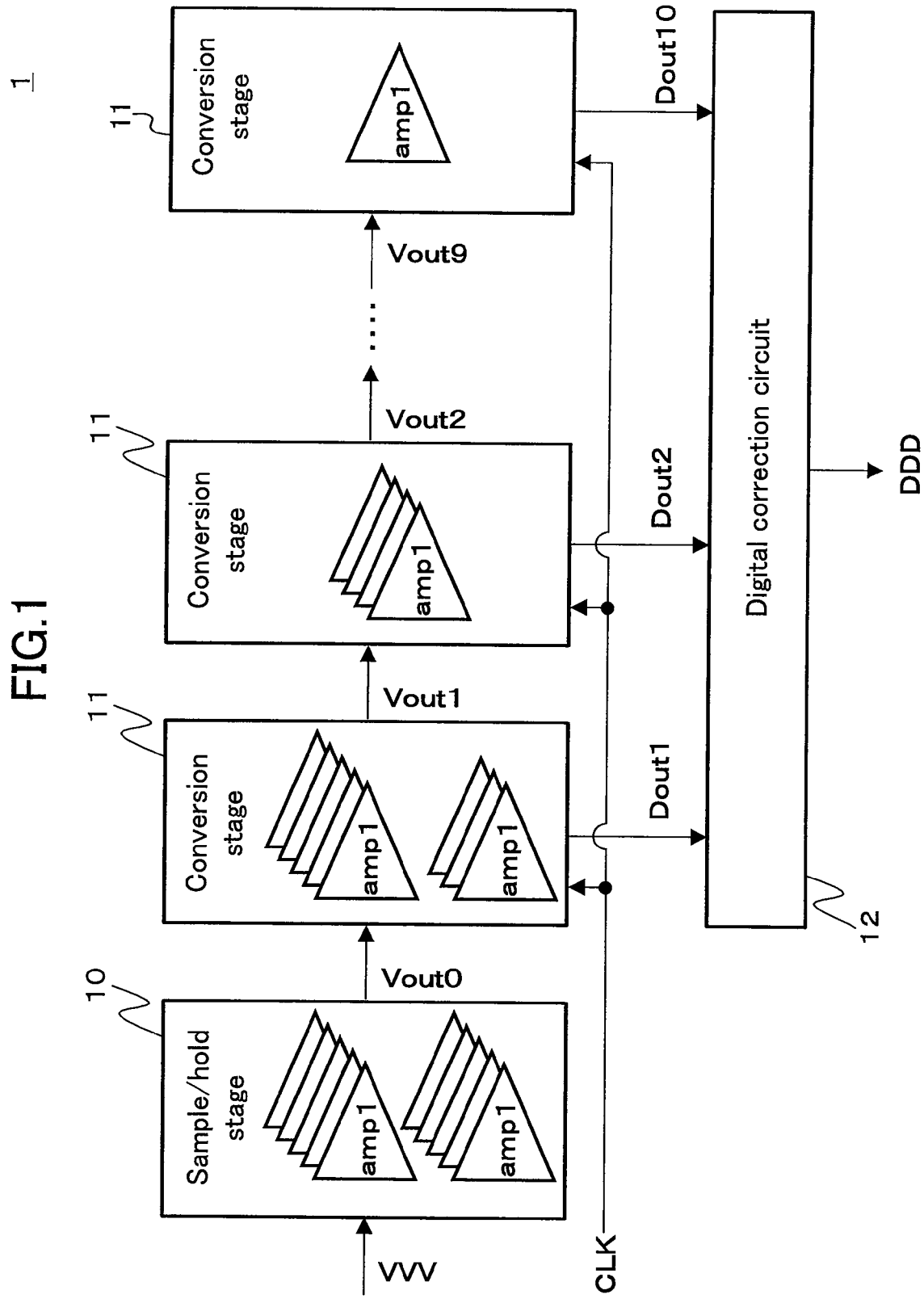
FIG. 1 is a view showing a configuration of a pipelined AD converter of Embodiment 1 of the present invention.

FIG. 1 shows a configuration of a pipelined AD converter 1 of Embodiment 1 of the present invention. The pipelined AD converter 1 includes a sample/hold stage 10 and a plurality of conversion stages 11, 11, . . . (a total of ten conversion stages in FIG. 1), which are cascaded.

The sample/hold stage 10 executes processing of sampling and holding an input voltage VVV and processing of outputting the held input voltage VVV as an output voltage Vout alternately in synchronization with a clock signal CLK.

Each of the conversion stages 11, 11, . . . executes digital/analog conversion processing and operation/amplification processing alternately in synchronization with the clock signal CLK. During the digital/analog conversion processing, the conversion stages 11, 11, . . . respectively output digital codes Dout1, Dout2, . . . based on output voltages Vout0, Vout1, . . . from the respective preceding stages, and also sample the output voltages Vout0, Vout1, . . . . During the operation/amplification processing, the conversion stages 11, 11, . . . respectively output the output voltages Vout1, Vout2, . . . to the next conversion stages based on the sampled voltages and intermediate voltages corresponding to the digital codes Dout1, Dout2, . . . .

The digital correction circuit 12 determines gain errors in the individual conversion stages 11, 11, . . . , corrects digital data (10-bit data in the illustrated example) consisting of the digital codes Dout1, Dout2, . . . , Dout10 based on the gain errors, and outputs the corrected digital data as digital data DDD.

Each of the conversion stages 11, 11, . . . includes one op-amp or a plurality of op-amps of the same type. In other words, the op-amps amp1, amp1, . . . are the same in configuration (e.g., the same in the types of components of the op-amps and the connection relationships therebetween), and are the same in current drive capability (e.g., the same in the sizes of components of the op-amps).

[Internal Configuration of Conversion Stage]

Figure 2:
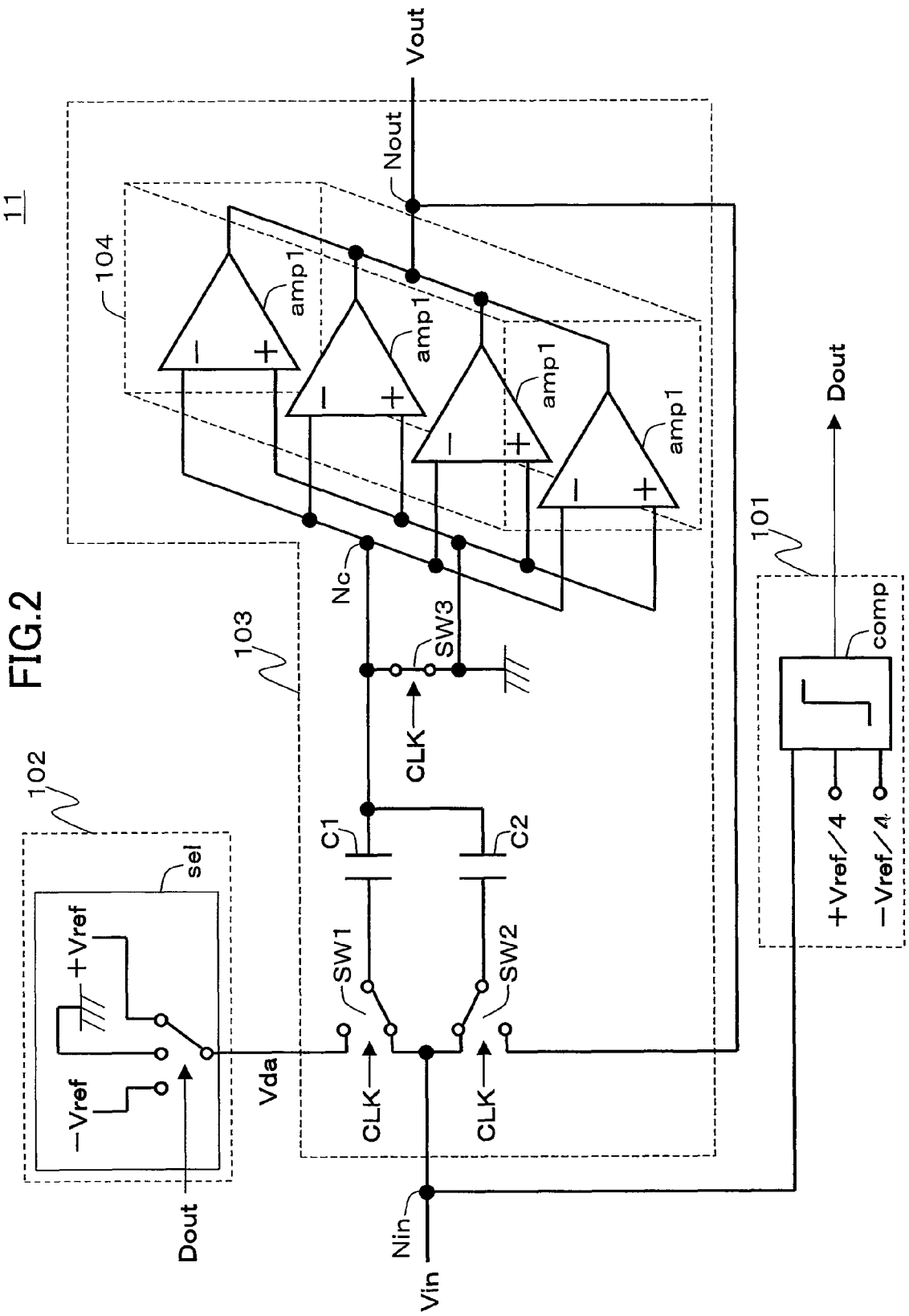
FIG. 2 is a view showing an internal configuration of a conversion stage shown in FIG. 1.

FIG. 2 shows an internal configuration of one conversion stage 11 shown in FIG. 1. Note that in FIG. 2, the conversion stage 11 is exemplified as including four op-amps amp1, amp1, . . . . The conversion stage 11 includes an analog-to-digital conversion circuit 101, a digital-to-analog conversion circuit 102, and a charge operation circuit 103.

The analog-to-digital conversion circuit 101 converts an input voltage Vin (e.g., the output voltage Vout0) fed to an input node Nin from the preceding conversion stage 11 (or the sample/hold stage 10) to a digital code Dout (e.g., the digital code Dout1). For example, the analog-to-digital conversion circuit 101 includes a comparator comp for comparing the input voltage Vin with reference voltages +Vref/4 and −Vref/4 and determining the value of the digital code Dout based on the comparison result. The input voltage Vin and the digital code Dout have the following correspondence, for example.

If $(Vin) < (-Vref/4)$, then $Dout = -1$

If $(-Vref/4) < (Vin) < (+Vref/4)$, then $Dout = 0$

If $(Vin) > (+Vref/4)$, then $Dout = +1$

The digital-to-analog conversion circuit 102 converts the digital code Dout obtained by the analog-to-digital conversion circuit 101 to an intermediate voltage Vda. For example, the digital-to-analog conversion circuit 102 includes a selector sel for selecting one among the reference voltages +Vref, GND (0), and −Vref according to the digital code Dout. The digital code Dout and the intermediate voltage Vda have the following correspondence, for example.

If $Dout = "-1,"$ then $Vda = "-Vref"$

If $Dout = "0,"$ then $Vda = "0"$

If $Dout = "+1,"$ then $Vda = "+Vref"$

The charge operation circuit 103 executes sampling processing of sampling the input voltage Vin and operation/amplification processing of amplifying a mixed voltage of the sampled input voltage Vin and the intermediate voltage Vda obtained by the digital-to-analog conversion circuit 102 alternately in synchronization with the clock signal CLK. The charge operation circuit 103 includes capacitors C1 and C2 (capacitor section), switches SW1, SW2, and SW3, and an amplifier section 104. The switches SW1, SW2, and SW3 respectively change the destination to which one end of the capacitor C1 is connected, the destination to which one end of the capacitor C2 is connected, and the destination to which the other ends of the capacitors C1 and C2 are connected.

During the sampling processing, the one end of each of the capacitors C1 and C2 is connected to the input node Nin, while the other end thereof is connected to a ground node. With this, the input voltage Vin is sampled by the capacitors C1 and C2. During the operation/amplification processing, the one end of the capacitor C1 is connected to the analog-to-digital conversion circuit 102 and the one end of the capacitor C2 is connected to an output node Nout, while the other end of each of the capacitors C1 and C2 is connected to a middle node Nc. With this, the mixed voltage of the input voltage Vin sampled by the capacitors C1 and C2 and the intermediate voltage Vda is amplified by the amplifier section 104. For example, when the gain of the amplifier section 104 is a desired value, the output voltage Vout is as follows.

$Vout = 2 \times (Vin - Dout \times (\frac{1}{2}) Vref)$

The amplifier section 104 includes a plurality of op-amps amp1, amp1, . . . , which are connected in parallel with each other between the middle node Nc and the output node Nout. To state specifically, the inverted input terminals of the op-amps amp1, amp1, . . . are commonly connected to the middle node Nc, the non-inverted input terminals thereof are commonly connected to the ground node, and the output terminals thereof are commonly connected to the output node Nout. Note that power supply terminals of the op-amps amp 1, amp 1, . . . may be commonly connected to a power supply node (not shown) for supplying power, or bias terminals thereof may be commonly connected to a bias node (not shown) for supplying a bias voltage.

The capacitance value of the capacitor section (capacitors C1 and C2) is not necessarily the same among the conversion stages 11, 11, . . . . For example, a conversion stage located closer to the first conversion stage 11 is greater in the capacitance value of the capacitor section. Likewise, the number of op-amps amp1 (number of parallel stages) is not necessarily the same among the conversion stages 11, 11, . . . .

In the pipelined AD converter of this embodiment, the current drive capability of each of the conversion stages 11, 11, . . . can be made greater as the number of op-amps amp1 (number of parallel stages) in the conversion stage 11 is greater. In this way, by increasing/decreasing the number of op-amps amp1 arranged in parallel in each of the conversion stages 11, 11, . . . , the current drive capability of the conversion stage 11 can be adjusted.

Also, with the op-amps amp1, amp1, . . . being the same in configuration, the layout can be designed easily compared with the case of designing op-amps individually for each conversion stage as conventionally done. In other words, the number of man-hours for layout design can be reduced. In addition, by aligning, in cell height, the op-amps amp1, amp1, . . . arranged in parallel, the regularity of the layout can be improved, and hence the layout density can be increased. This contributes to reduction in the circuit area of the entire pipelined AD converter.

Moreover, although the number of op-amps amp1 arranged in parallel differs among the conversion stages 11, 11, . . . , the gain (gain of the amplifier section 104) is the same among the conversion stages 11, 11, . . . . Hence, if a gain error in one conversion stage 11 is known, gain errors in the other conversion stages 11 can be estimated. For example, it can be estimated that the gain errors in the conversion stages 11, 11, . . . decrease by (½) every stage from the first conversion stage downstream. In this way, the gain errors in the individual conversion stages 11, 11, . . . can be easily determined compared with the case of designing op-amps individually for each conversion stage as conventionally done.

Also, by correcting digital data (executing digital correction) based on the gain error in each of the individual conversion stages 11, 11, . . . as in this embodiment, the digital data DDD of an appropriate value can be obtained even if the gain in each of the conversion stages 11, 11, . . . is smaller than a desired value. This eliminates the necessity of designing the gain of the op-amps amp1 included in each of the conversion stages 11, 11, . . . so that the gain in the first conversion stage becomes a desired value, and hence can suppress the circuit scale and the power consumption from excessively increasing in each of the conversion stages 11, 11, . . . . In addition, the piped AD converter 1 of this embodiment is allowed to determine the gain error in each of the conversion stages 11, 11, . . . in a short time.

[Input/Output Characteristic of Pipelined AD Converter]

Referring to FIGS. 3A, 3B, 4A, and 4B, the input/output characteristic (correspondence between the input voltage VVV and the digital data DDD) of the pipelined AD converter of this embodiment is compared with the input/output characteristic of the conventional pipelined AD converter.

Figure 3:
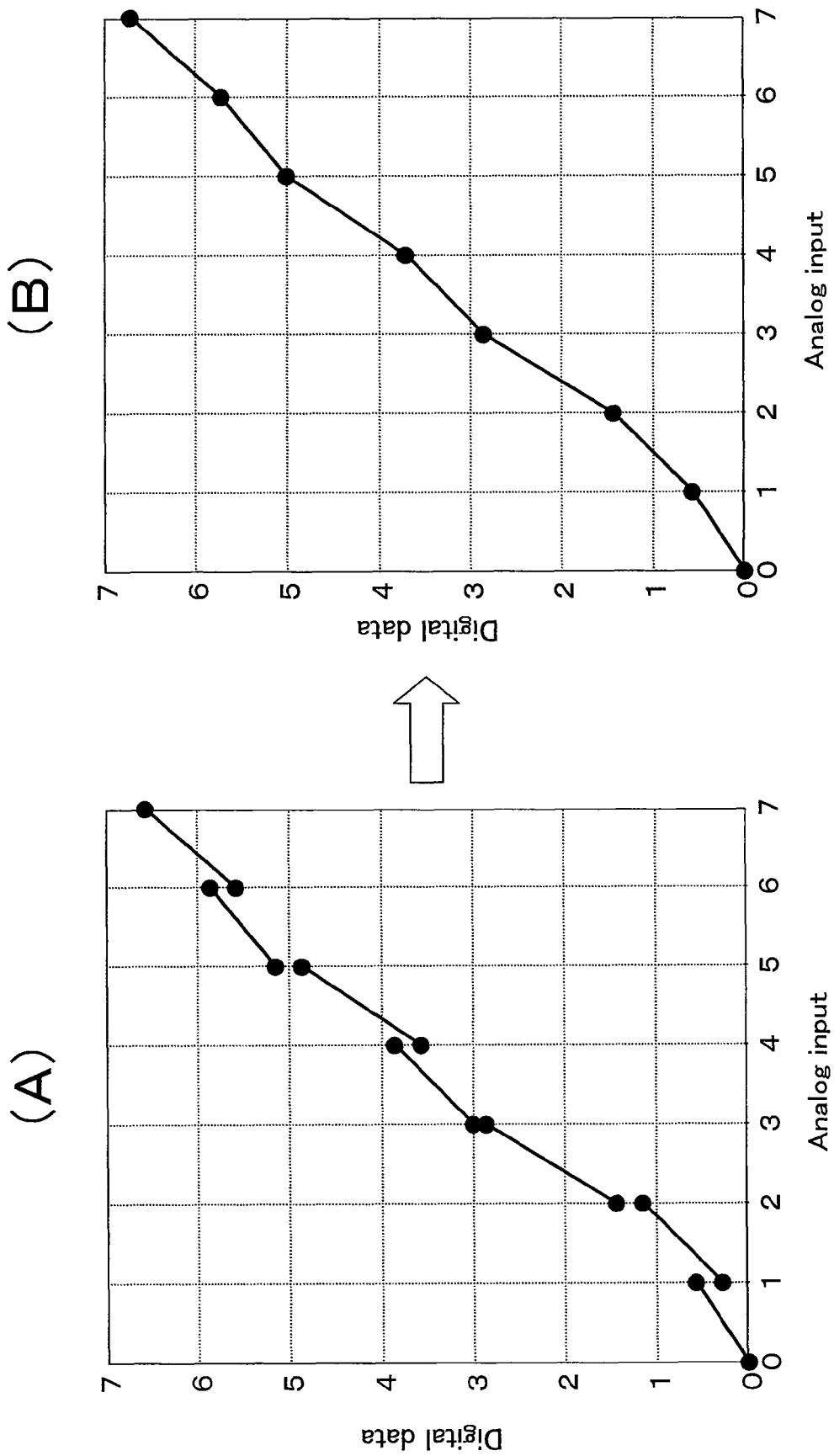
FIG. 3A is a view showing the input/output characteristic of a pipelined AD converter with the gain different among conversion stages before digital correction.
FIG. 3B is a view showing the input/output characteristic of this pipelined AD converter after digital correction.

When a gain error occurs in each of the conversion stages, the input/output characteristic of the conventional pipelined AD converter is as shown in FIG. 3A. That is, in the conventional pipelined AD converter, in which the gain differs among the conversion stages, the input/output characteristic is not only discontinuous but also has slopes different segment by segment. Therefore, when the digital output of the conventional pipelined AD converter is corrected using a digital correction technique, the input/output characteristic becomes continuous but still has slopes different segment by segment, as shown in FIG. 3B. Hence, it is difficult to improve the linearity of the input/output characteristic.

Figure 4:
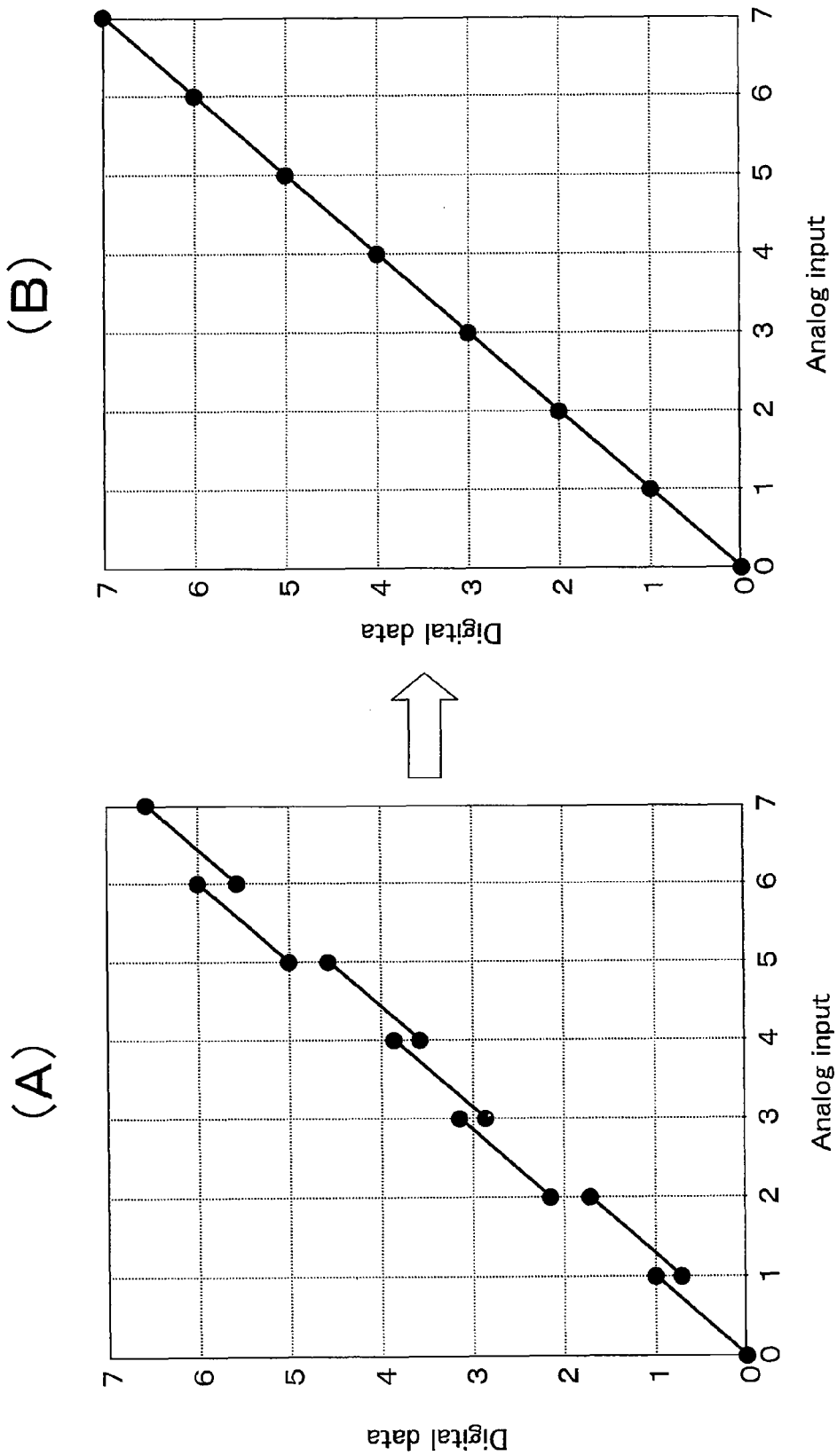
FIG. 4A is a view showing the input/output characteristic of the pipelined AD converter of FIG. 1 before digital correction.
FIG. 4B is a view showing the input/output characteristic of the pipelined AD converter of FIG. 1 after digital correction.

Contrarily, the pipelined AD converter 1 of this embodiment, in which the gain is the same among the conversion stages 11, 11, . . . , the input/output characteristic is as shown in FIG. 4A when a gain error occurs in each of the conversion stages. That is, the input/output characteristic is discontinuous but has the same slope in all segments. Therefore, when the digital output of the pipelined AD converter 1 is corrected with the digital correction circuit 12, the input/output characteristic not only becomes continuous but also has a slope of a straight line (uniform over the entire slope), as shown in FIG. 4B. In this way, it is easy to improve the linearity of the input/output characteristic, and the S/N ratio can be easily improved.

[Digital Correction Circuit]

Figure 5:
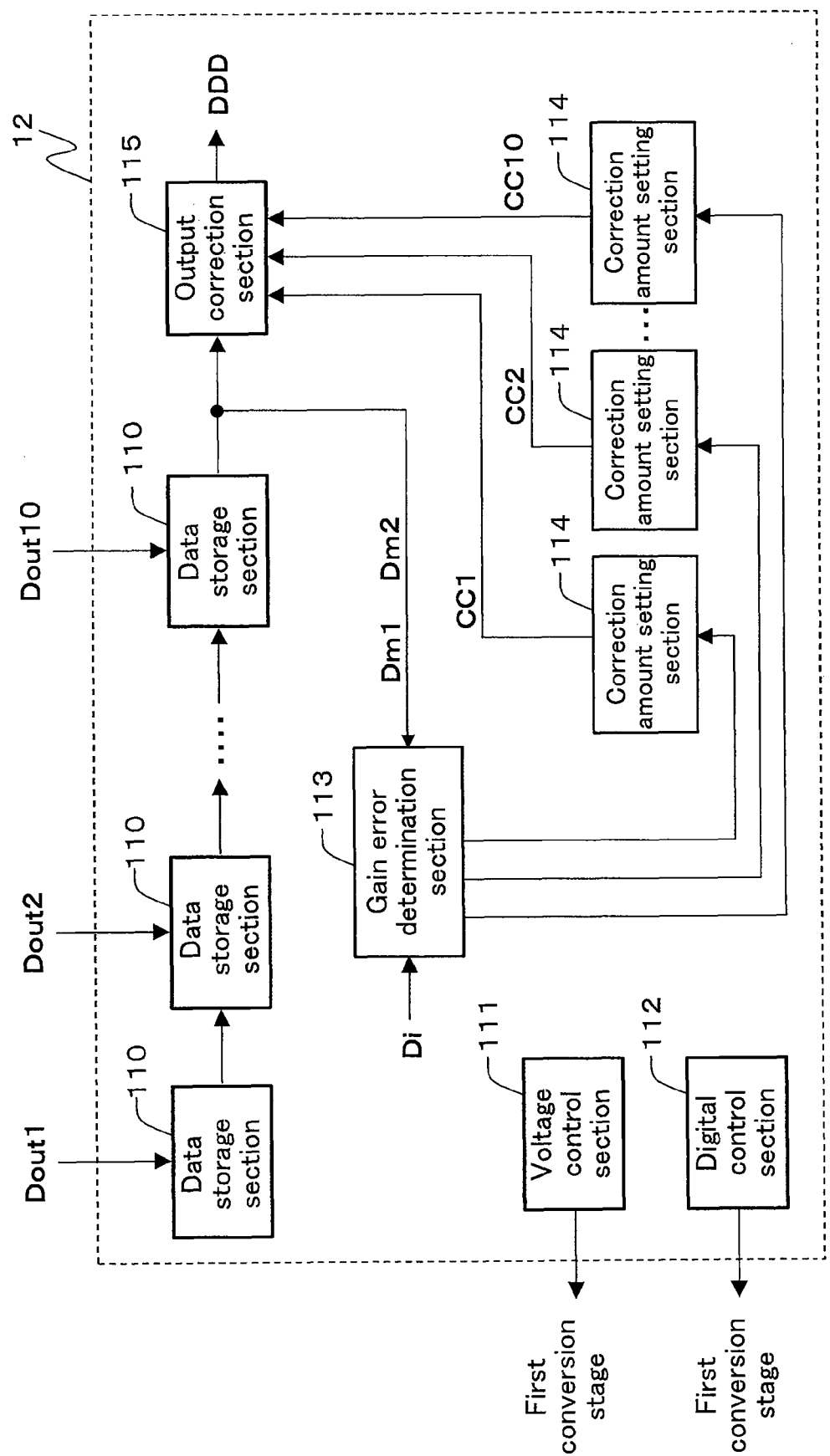
FIG. 5 is a view showing an example of the configuration of a digital correction circuit shown in FIG. 1.

Next, referring to FIG. 5, the digital correction circuit 12 shown in FIG. 1 will be described in a specific manner. In the digital correction circuit 12 of FIG. 5, data storage sections 110, 110, . . . , respectively provided for the conversion stages 11, 11, . . . (in the illustrated example, a total of ten data storage sections are provided), acquire their corresponding digital codes Dout1, Dout2, . . . , Dout10 and sequentially transfer the acquired digital codes to the next-stage storage sections.

The operation of the digital correction circuit 12 will be described. Assume herein that the first conversion stage 11 is to be measured. First, a voltage control section 111 fixes the voltage value of the input voltage (output voltage Vout0) fed to the first conversion stage 11 to an appropriate predetermined value (e.g., +Vref/4, −Vref/4, or the like). Thereafter, a digital control section 112 supplies a digital code indicating "0" to the digital-to-analog conversion circuit 102 in the first conversion stage 11, so that the intermediate voltage Vda of the digital-to-analog conversion circuit 102 becomes "0." In the second and subsequent conversion stages 11, 11, . . . , the analog/digital conversion processing and the operation/amplification processing are executed, to output the digital codes Dout2, . . . , Dout10. A gain error determination section 113 holds the digital codes Dout2, . . . , Dout10 transferred from the data storage sections 110, 110, . . . as digital data Dm1.

Subsequently, the digital control section 112 supplies a digital code indicating "−1" to the digital-to-analog conversion circuit 102 in the first conversion stage 11, so that the intermediate voltage Vda of the digital-to-analog conversion circuit 102 becomes "−Vref." In the second and subsequent conversion stages 11, 11, . . . , the analog/digital conversion processing and the operation/amplification processing are executed again, to output the digital codes Dout2, . . . , Dout10. The gain error determination section 113 then holds the digital codes Dout2, . . . , Dout10 transferred from the data storage sections 110, 110, . . . as digital data Dm2.

The gain error determination section 113 then determines the difference between the two units of digital data Dm1 and Dm2. The value of this difference data corresponds to digital data obtained by subjecting the reference voltage Vref amplified by the amplifier section 104 in the first conversion stage to sequential analog/digital conversion by the second and subsequent conversion stages 11, 11, . . . . Thereafter, the gain error is determination section 113 compares the difference data with ideal data Di (e.g., difference data obtained when no gain error occurs) to determine a gain error in the first conversion stage (e.g., determine the difference between the difference data and the ideal data Di as the gain error).

Correction amount calculation sections 114, 114, . . . , respectively provided for the conversion stages 11, 11, . . . , estimate gain errors in the corresponding conversion stages 11 based on the gain error obtained by the gain error determination section 113 and set correction amounts CC1, CC2, ..., CC10 corresponding to the estimated gain errors. For example, the correction amount calculation sections 114, 114, ... estimate that the gain errors in the conversion stages 11, 11, ... decrease by (½) every stage in the order from the first conversion stage 11 downstream. In this case, the correction amount CC1 is a value corresponding to the gain error in the first conversion stage 11, and the correction amounts CC2, ..., CC10 are respectively CC1×(½), ..., CC1×(½)$^9$.

In the manner described above, the correction amounts CC1, CC2, ..., CC10 for the conversion stages 11, 11, ... are obtained. An output correction section 115 corrects the digital data consisting of the digital codes Dout1, Dout2, ..., Dout10 based on the correction amounts CC1, CC2, ..., CC10 (e.g., subtracts the correction amounts CC1, CC2, ..., CC10 from the digital data), and outputs the corrected data as the digital data DDD.

As described above, since the correction amounts for the individual conversion stages 11, 11, ... can be set with only the measurement of the gain error in one conversion stage 11, the time for measuring the gain errors can be shortened, and hence setting of the correction amounts can be speedily executed. Also, since it is unnecessary to prepare data (ideal data, etc.) required for digital correction individually for the conversion stages 11, 11, ..., the memory for storing data required for digital correction can be reduced.

Note that the conversion stage for which the gain error is measured may otherwise be a second or subsequent conversion stage. However, as the conversion stage for measurement is located closer to the first conversion stage, the number of bits of digital data (i.e., the number of digital codes) obtained as the gain error measurement result is greater, and hence the gain error can be measured with higher precision. Otherwise, the digital correction may be made based on the measurement results for two or more conversion stages.

The digital correction circuit 12 is not limited to that described above. For example, a variety of measurement methods may be adopted, including a method in which the gain error is measured by intermittently stopping the pipelining operation, and a method in which the gain error is measured in parallel with the pipelining operation. There are also a variety of methods for measuring the gain error. By adopting any of digital correction techniques, the effect of permitting easy measurement of a gain error can be obtained.

[Number of Parallel Op-Amps]

Next, the number of op-amps arranged in parallel in each of the conversion stages 11, 11, ... will be described in detail. As the number of parallel op-amps amp1 increases, the current drive capability of the conversion stage 11 can be increased, but the circuit area and power consumption of the conversion stage 11 also increase. Hence, the number of parallel op-amps in each of the conversion stages 11, 11, ... is preferably determined based on the capacitance value of the load capacitance of the conversion stage 11 (the capacitance value of the capacitors C1 and C2 included in the conversion stage 11, the input capacitance of the next conversion stage, and the like).

In general, the capacitance value of the load capacitance of a conversion stage 11 is greater as the conversion stage 11 is closer to the first conversion stage. For example, when the load capacitance value of the conversion stage 11 decreases by (½) every stage in the order from the first conversion stage 11 toward the tenth conversion stage 11, it is preferred to design so that the number of parallel op-amps amp1 decreases by (½) every stage in the order from the first conversion stage 11 toward the tenth conversion stage. To state specifically, it is designed so that the number of parallel op-amps amp 1 is "$2^9$=512" for the first conversion stage, "$2^8$=256" for the second conversion stage, "$2^7$=128" for the third conversion stage, and "$2^0$=1" for the tenth conversion stage.

If the capacitance value of the capacitors C1 and C2 in each of the conversion stages 11, 11, ... is extremely small, it will be difficult to design the capacitors C1 and C2 with high precision. Therefore, it is realistic to design the load capacitances of the conversion stages 11, 11, ... as follows when the load capacitance of the first conversion stage 11 is "C0."

First conversion stage: C0
Second conversion stage: C0×(½)
Third conversion stage: C0×(½)$^2$
Fourth and subsequent conversion stages: C0×(½)$^3$ In the above case, it is preferred to design the number of parallel op-amps in each of the conversion stages 11, 11, ... as follows.

First conversion stage: 8
Second conversion stage: 4
Third conversion stage: 2
Fourth and subsequent conversion stages: 1

As described above, the current drive capability of the conversion stage 11 can be reduced in the order from the first conversion stage toward the final conversion stage by increasing the number of parallel op-amps as the conversion stage is closer to the first conversion stage. With this, the settling error can be reduced (or even eliminated) in each of the conversion stages 11, 11, ..., and also the circuit area and power consumption of the entire pipelined AD converter can be reduced.

[Sample/Hold Stage]

Figure 6:
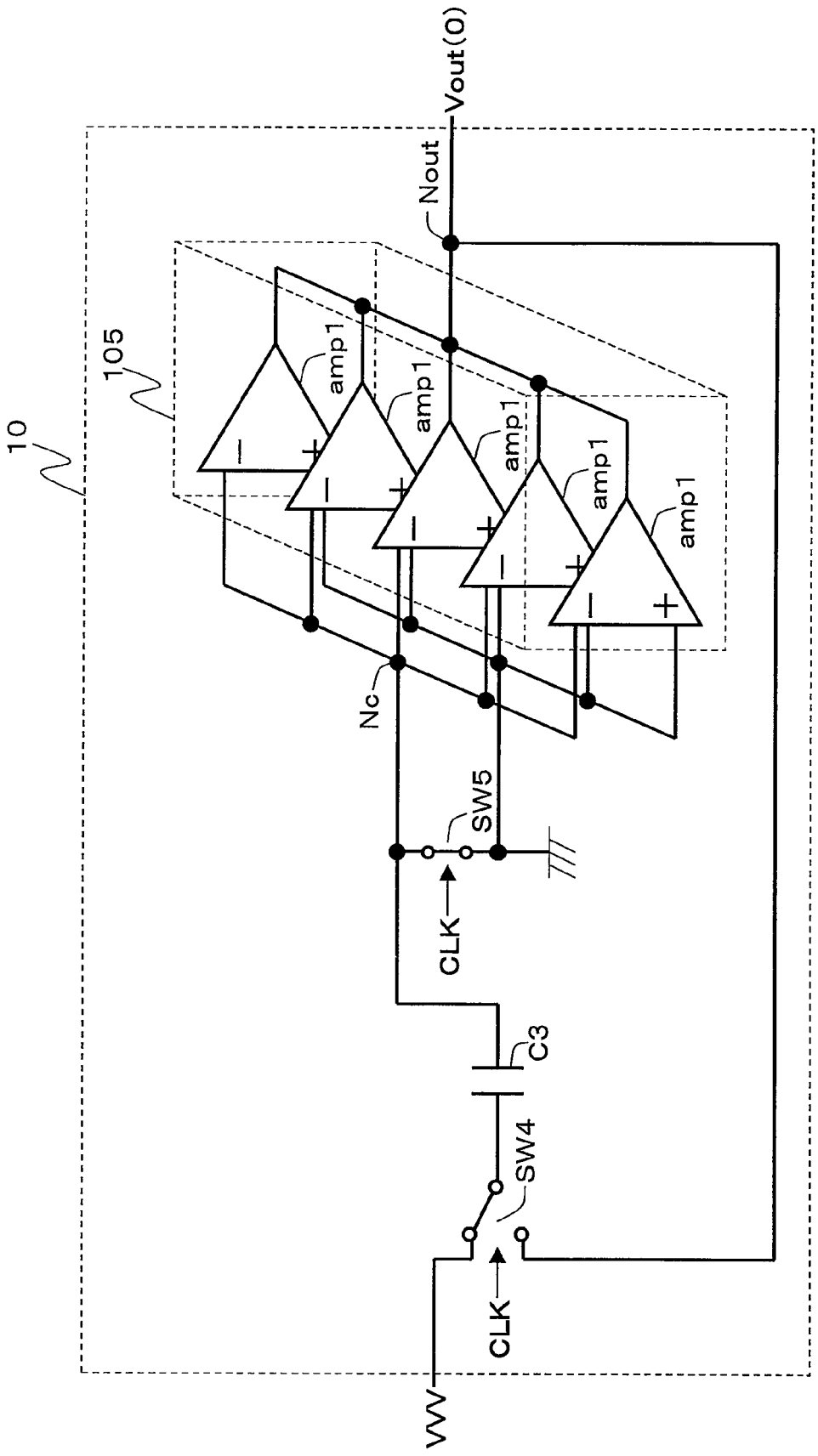
FIG. 6 is a view showing an internal configuration of a sample/hold stage shown in FIG. 1.

The sample/hold stage 10 may also include a plurality of op-amps amp1, amp1, ... connected in parallel with each other. As shown in FIG. 6, the sample/hold stage 10 includes: a capacitor C3 (capacitor circuit) for sampling the external input voltage VVV; and a transfer circuit 105 for transferring the input voltage VVV sampled by the capacitor C3 to the first conversion stage 11. The transfer circuit 105 includes a plurality of op-amps amp1, amp1, ..., which are connected in parallel with each other between a middle node Nc and an output node Nout, as in the conversion stages 11. Switches SW4 and SW5 respectively change the destination to which one end of the capacitor C3 is connected and the destination to which the other end of the capacitor C3 is connected, in synchronization with the clock signal CLK.

With the above configuration, the current drive capability of the sample/hold stage 10 can be adjusted by increasing/decreasing the number of parallel op-amps. Also, with the op-amps amp1, amp1, ... being the same in configuration, the layout can be easily designed, and the number of man-hours for layout design can be reduced. Moreover, since the gain of the sample/hold stage 10 can be made identical to the gain of the conversion stages 11, the gain error of the sample/hold stage 10 can be easily estimated based on the gain error of a conversion stage 11. For example, when the gain error of the first conversion stage 11 is "ΔK," the gain error of the sample/hold stage 10 can be estimated to be "ΔK×(½)."

Alteration of Embodiment 1

Figure 7:
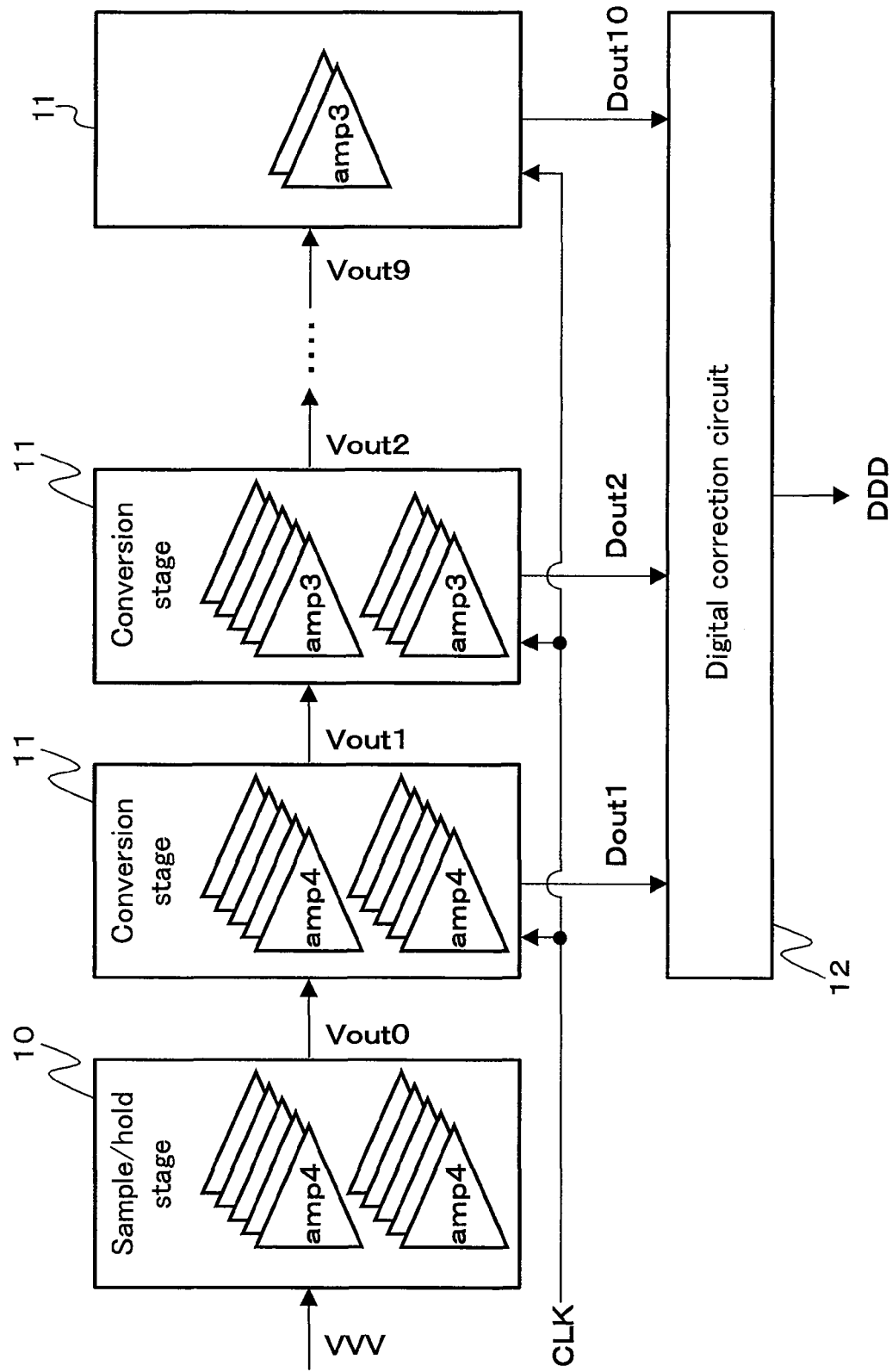
FIG. 7 is a view showing an alteration of the pipelined AD converter of FIG. 1.

As shown in FIG. 7, two or more types of op-amps (two types of op-amps amp3 and amp4 in the illustrated example) may exist in the conversion stages 11, 11, .... The op-amps amp3 and amp4 have are the same in configuration but different in current drive capability from each other. In other words, each of the plurality of op-amps included in the conversion stages 11, 11, ... may have either one of two or more current drive capabilities.

Note that in the pipelined AD converter 1a shown in FIG. 7, the configurations of the conversion stages 11, 11, ... and the sample/hold stage 10 are the same as those shown in FIGS. 2 and 6 except that each of the op-amps amp1 in FIGS. 2 and 6 is replaced with the op-amp amp3 or amp4.

In general, the greater the drive capability of an op-amp is, the greater the scale of the components of the op-amp is (the greater the circuit area is). Therefore, it is considered that by increasing the number of parallel op-amps, the current drive capability per op-amp can be reduced and hence the circuit area of the op-amp may be reduced. However, in the case that the minimum sizes of elements are specified in a fabrication process, for example, the circuit area of each op-amp cannot be made smaller than its specified minimum size. In such a case, no reduction in the circuit area of the op-amp is expected. Meanwhile, there is a case where a circuit having a somewhat large area is better in area efficiency than a circuit having an excessively small circuit area because the former can share a guard band, a well, and the like with other circuit. In other words, in some cases, by configuring a conversion stage 11 with op-amps large in current drive capability, rather than configuring a conversion stage 11 with op-amps small in current drive capability, the number of parallel op-amps can be reduced, and resultantly the circuit area can be reduced.

The design of the pipelined AD converter using the op-amps amp3 and amp4 will be described in a specific manner. It is herein assumed that the op-amps amp3 and amp4 have the same configuration as the op-amps amp1 and respectively have current drive capabilities three and four times as large as the op-amps amp 1.

For example, assume that to put the conversion stages 11, 11, ... in their optimum states (for example, to ensure occurrence of no settling error), the conversion stages 11, 11, ... are configured using one type of op-amp amp1 as follows.

First conversion stage: op-amp amp1×40
Second conversion stage: op-amp amp1×27
Third conversion stage: op-amp amp1×18
Fourth conversion stage: op-amp amp1×12
Fifth conversion stage: op-amp amp1×8
Sixth and subsequent conversion stages: op-amp amp1×6

In the above example, the first conversion stage 11 will have a current drive capability equivalent to 40 op-amps amp1.

When only the op-amps amp3 are used to configure the conversion stages 11, 11, ... having respective current drive capabilities close to those in the above example, the conversion stages 11, 11, ... will be configured as follows.

First conversion stage: op-amp amp3×14
Second conversion stage: op-amp amp3×9
Third conversion stage: op-amp amp3×6
Fourth conversion stage: op-amp amp3×4
Fifth conversion stage: op-amp amp3×3
Sixth and subsequent conversion stages: op-amp amp3×2

As is found from the above, when the conversion stages 11, 11, ... are configured using only the op-amps amp3, the first and fifth conversion stages will have respective current drive capabilities equivalent to 42 op-amps amp1 and 9 op-amps amp1, which means that power will be consumed excessively in the first and fifth conversion stages. If the first conversion stage is configured to have "13 op-amps amp 3," it will only have a current drive capability equivalent to 39 op-amps amp1, which will cause a settling error.

Likewise, when only the op-amps amp4 are used, the conversion stages 11, 11, ... will be configured as follows.

First conversion stage: op-amp amp4×10
Second conversion stage: op-amp amp4×7
Third conversion stage: op-amp amp4×5
Fourth conversion stage: op-amp amp4×3
Fifth conversion stage: op-amp amp4×2
Sixth and subsequent conversion stages: op-amp amp4×2

In the above example, also, power will be consumed excessively in the second, third, sixth and subsequent conversion stages.

When two types of the op-amps amp3 and amp4 are used, the conversion stages 11, 11, ... will be configured as follows.

First conversion stage: op-amp amp4×10
Second conversion stage: op-amp amp3×9
Third conversion stage: op-amp amp3×6
Fourth conversion stage: op-amp amp4×3
Fifth conversion stage: op-amp amp4×2
Sixth and subsequent conversion stages: op-amp amp3×2

As described above, by using two or more types of op-amps to configure the conversion stages 11, 11, ... , the current drive capability of each of the conversion stages 11, 11, ... can be designed appropriately with no excess or shortage. Also, since op-amps having a large current drive capability can be used compared with the case of using only one type of op-amps to configure the conversion stages 11, 11, ... , the op-amps can be placed efficiently in each of the conversion stages 11, 11, ... , and resultantly the circuit area of each of the conversion stages 11, 11, ... can be reduced.

Embodiment 2

Figure 8:
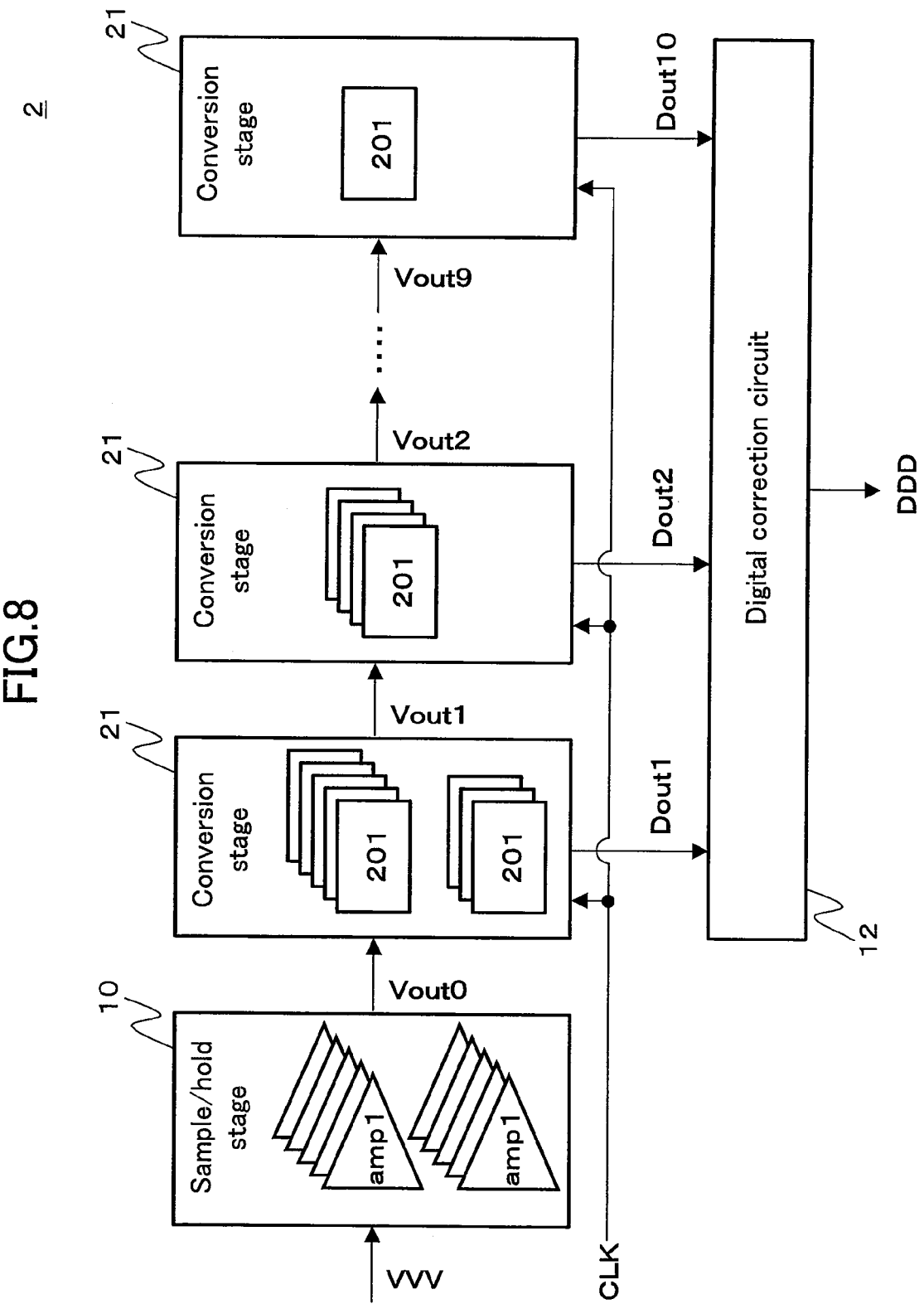
FIG. 8 is a view showing a configuration of a pipelined AD converter of Embodiment 2 of the present invention.

FIG. 8 shows a configuration of a pipelined AD converter 2 of Embodiment 2 of the present invention. The AD converter 2 includes a plurality of cascaded conversion stages 21, 21, ... and the sample/hold stage 10 shown in FIG. 1. Each of the conversion stages 21, 21, ... includes one or a plurality of charge operation circuits of the same type. Specifically, op-amps included in charge operation circuits 201, 201, ... have the same configuration and the same current drive capability, and capacitor sections of the charge operation circuits 201, 201, ... have the same capacitance value.

[Internal Configuration of Conversion Stage]

Figure 9:
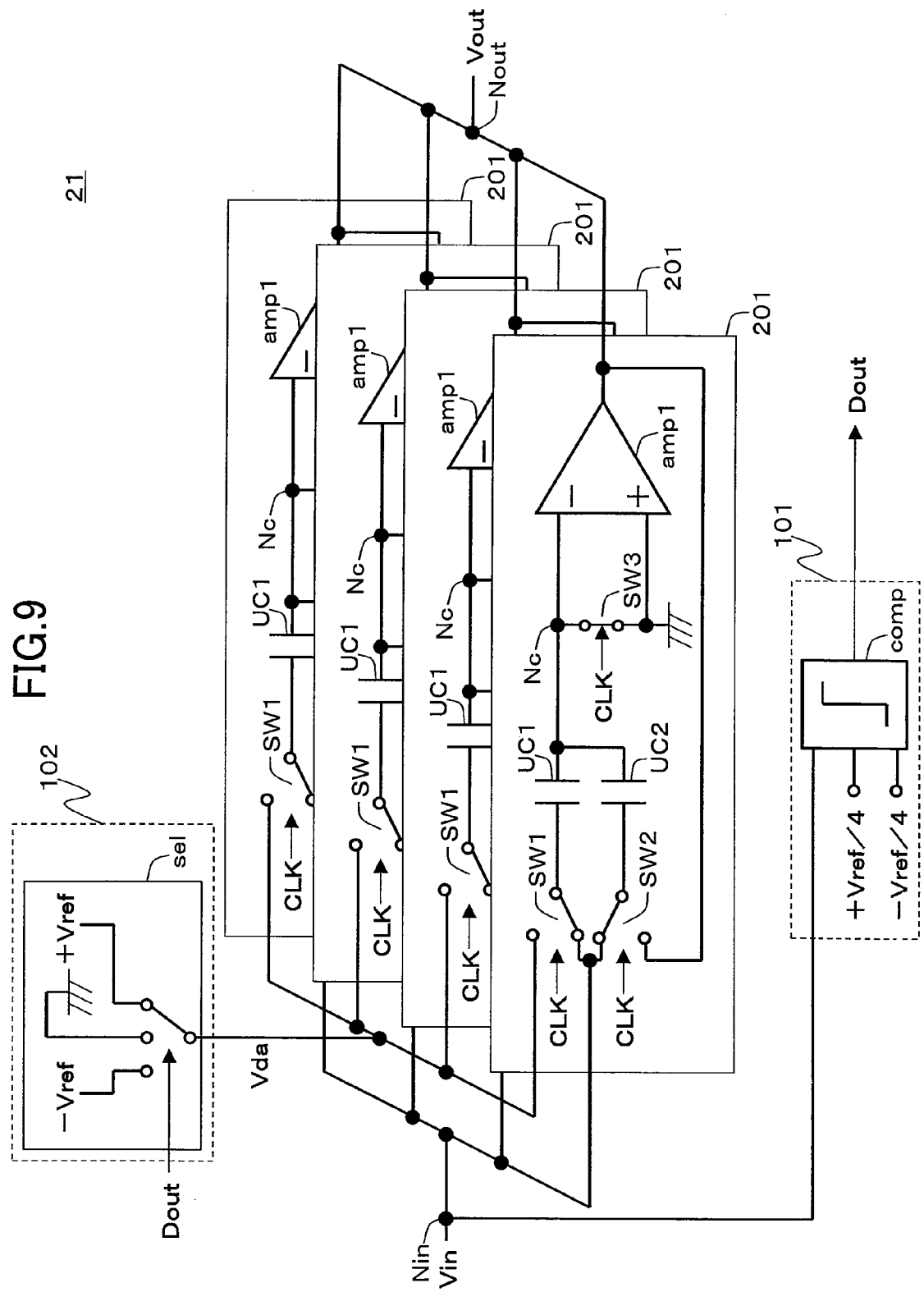
FIG. 9 is a view showing an internal configuration of a conversion stage shown in FIG. 8.

FIG. 9 shows an internal configuration of one conversion stage 21 shown in FIG. 8. The conversion stage 21 includes: a plurality of charge operation circuits 201, 201, ... ; and the analog-to-digital conversion circuit 101 and the digital-to-analog conversion circuit 102 shown in FIG. 2. The plurality of charge operation circuits 201, 201, ... are connected in parallel with each other between an input node Nin and an output node Nout.

Each of the charge operation circuits 201, 201, ... includes capacitors UC1 and UC2 (capacitor section) in place of the capacitors C1 and C2 shown in FIG. 2. The other configuration is the same as the charge operation circuit 103 in FIG. 2. The capacitance value of the capacitor section (capacitors UC1 and UC2) is the same among the charge operation circuits 201, 201, .... In other words, in the conversion stage 21, not only the op-amps amp 1 but also the other components of the charge operation circuits (the capacitors UC1 and UC2, the switches SW1, SW2, and SW3, etc.) are arranged in parallel. The capacitor section of each of the charge operation circuits 201, 201, ... has a capacitance value corresponding to the current drive capability of the op-amp amp1 included in the charge operation circuit 201. For example, the capacitance value of the capacitor section is greater as the current drive capability of the op-amp amp1 is greater.

As described above, by arranging not only the op-amps amp1 but also the other components of the charge operation circuits 201 in parallel, the influence of the capacitors UC1 and UC2 and the switches SW1, SW2, and SW3 on the op-amp amp1 can be made roughly the same among the conversion stages 21, 21, . . . . With this, a deviation in gain among the conversion stages 21, 21, . . . can be reduced.

Also, with the charge operation circuits 201, 201, . . . being the same in configuration, the layout can be designed further easily, and the circuit scale of each of the conversion stages 21, 21, . . . can be further reduced, compared with the case of arranging only the op-amps amp1 in parallel.

Moreover, although the number of charge operation circuits 201 arranged in parallel differs among the conversion stages 21, 21, . . . , the gain is the same among the conversion stages 21, 21, . . . . Hence, if a gain error in one conversion stage 21 is known, gain errors in the other conversion stages 21 and the sample/hold stage 10 can be estimated, and thus the gain errors in the conversion stages 21, 21, . . . can be easily determined. Also, it is easy to improve the linearity of the input/output characteristic, and the S/N ratio can be easily improved. Hence, the pipelined AD converter 2 of this embodiment is very suited to digital correction techniques.

The number of charge operation circuits 201 (number of parallel stages) is not necessarily the same among the conversion stages 21, 21, . . . . For example, the number of parallel charge operation circuits 201 is made greater for a conversion stage 21 closer to the first conversion stage. With this, the amplification precision and the current drive capability can be set appropriately for each of the conversion stages 21, 21, . . . , and also the circuit scale and the power consumption can be set appropriately for each of the conversion stages 21, 21, . . . .

Figure 10:
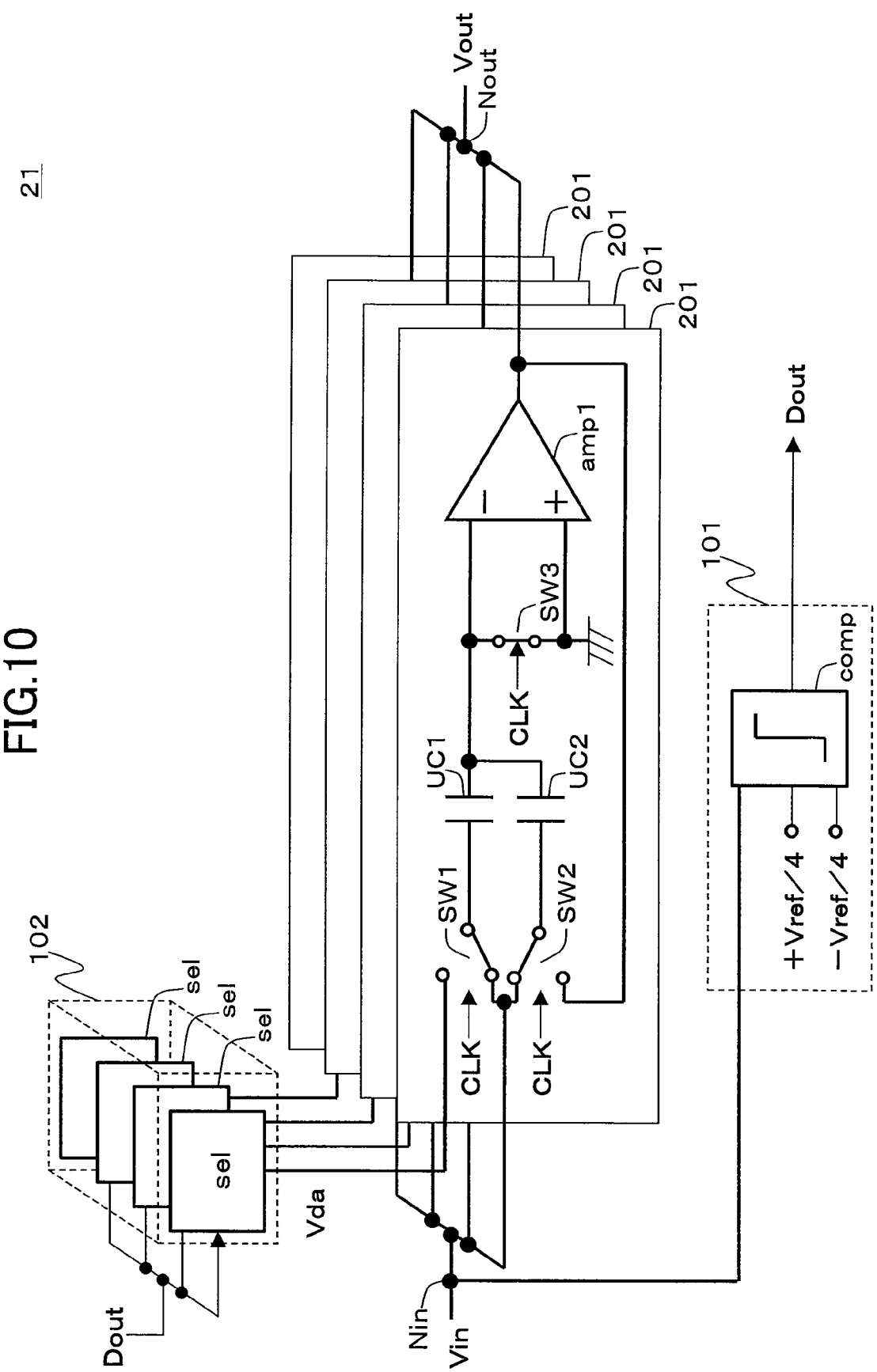
FIG. 10 is a view showing an alteration of the conversion stage of FIG. 9.

Also, as shown in FIG. 10, the digital-to-analog conversion circuit 102 may include a plurality of selectors (digital-to-analog conversion sections) sel, sel, . . . provided to correspond to the charge operation circuits 201, 201, . . . . Each of the selectors sel, sel, converts the digital code Dout to the intermediate voltage Vda. In this case, each of the charge operation circuits 201, 201, . . . receives the intermediate voltage Vda from the selector sel corresponding to the charge operation circuit 201. With this configuration, the layout can be designed further easily, and the circuit area of each of the conversion stages 21, 21, . . . can be further reduced, compared with the case of arranging only the charge operation circuits 201, 201, . . . in parallel.

Figure 11:
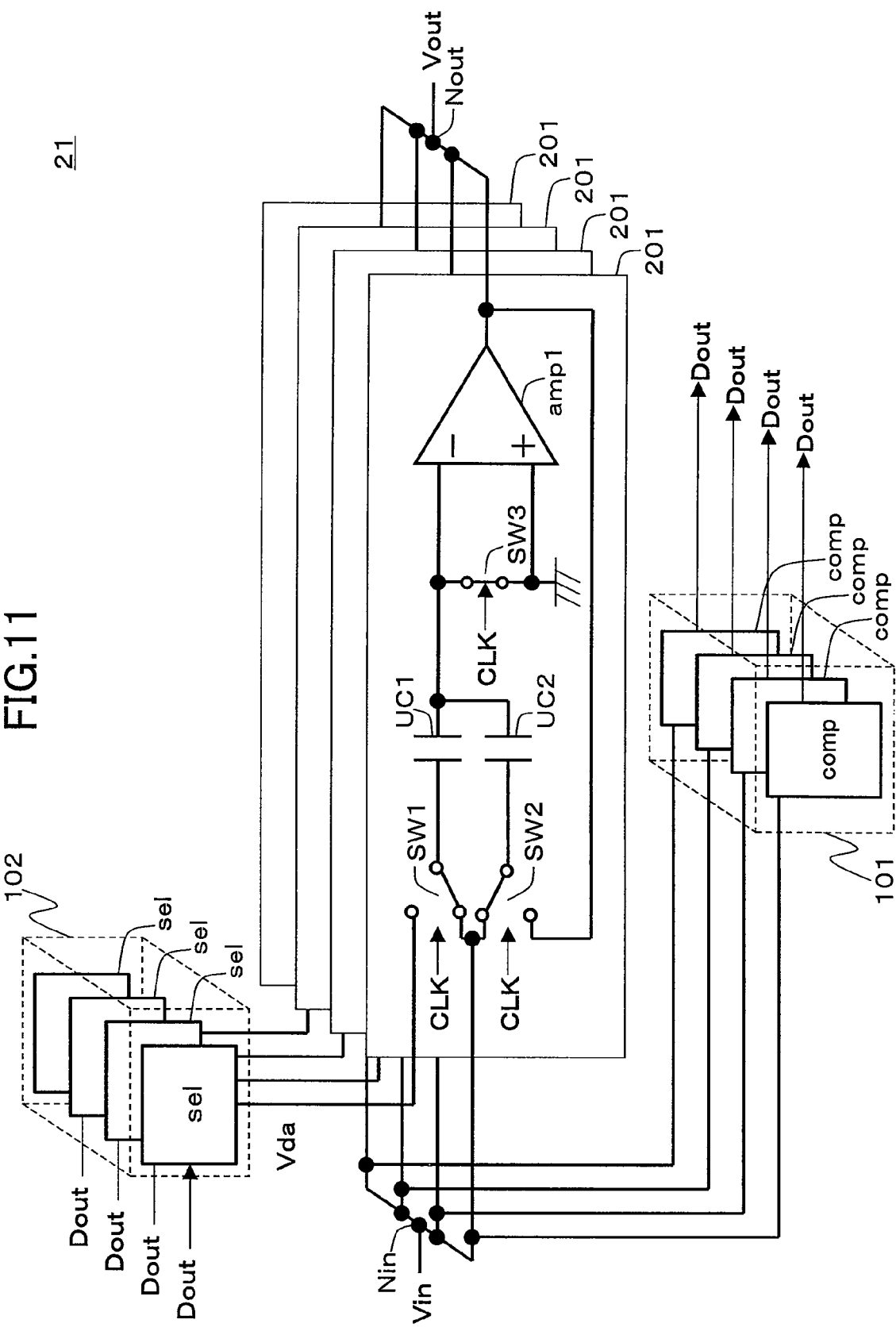
FIG. 11 is a view showing another alteration of the conversion stage of FIG. 9.

Moreover, as shown in FIG. 11, the analog-to-digital conversion circuit 101 may includes a plurality of comparators (analog-to-digital conversion sections) comp, comp, . . . provided to correspond to the plurality of selectors sel, sel, . . . . Each of the comparators comp, comp, . . . converts the input voltage Vin to the digital code Dout. In this case, each of the selectors sel, sel, . . . converts the digital code Dout obtained by the comparator comp corresponding to the selector sel to the intermediate voltage Vda.

Alteration of Embodiment 2

Figure 12:
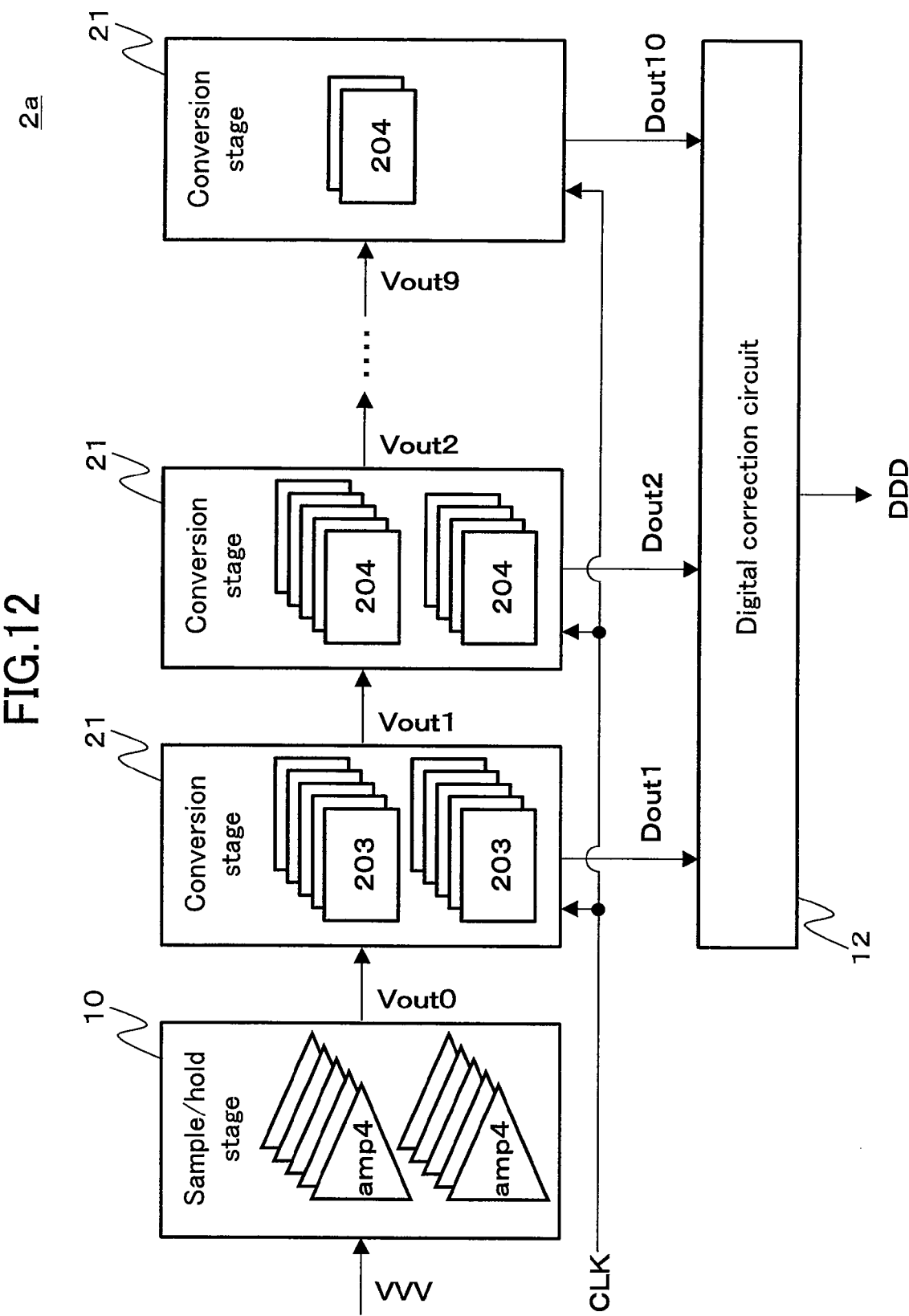
FIG. 12 is a view showing an alteration of the pipelined AD converter of FIG. 8.

As shown in FIG. 12, two or more types of charge operation circuits (charge operation circuits 203 and 204 in the illustrated example) may exist in the conversion stages 21, 21, . . . . The op-amps included in the charge operation circuits 203 and 204 are the same in configuration but different from each other in current drive capability. The capacitor sections in the charge operation circuits 203 and 204 have capacitance values corresponding to the respective charge operation circuits (i.e., capacitance values different from each other). In other words, each of the op-amps in the plurality of charge operation circuits included in the conversion stages 21, 21, . . . may have any one of two or more current drive capabilities.

Note that in the pipelined AD converter 2a of FIG. 12, the configuration of each of the conversion stages 21, 21, . . . is the same as that shown in FIG. 9 except that the charge operation circuits 201, 201, . . . in FIG. 9 are replaced with the charge operation circuits 203 or 204.

FIGS. 13A and 13B respectively show internal configurations of the charge operation circuits 203 and 204 shown in FIG. 12. The charge operation circuits 203 and 204 respectively include a capacitor section (capacitors UC31 and UC32) and an op-amp amp3 and a capacitor section (capacitors UC41 and UC42) and an op-amp amp4, in place of the capacitor section (capacitors UC1 and UC2) and the op-amp amp1 shown in FIG. 9. The other configuration is the same as that of the charge operation circuits 201 shown in FIG. 9. The capacitor section (capacitors UC31 and UC32) has a capacitance value corresponding to the current drive capability of the op-amp amp3, and the capacitor section (capacitors UC41 and UC42) has a capacitance value corresponding to the current drive capability of the op-amp amp4.

As described above, by using two or more types of charge operation circuits to configure the conversion stages 21, 21, . . . , the capacitance value and current drive capability of each of the conversion stages 21, 21, . . . can be designed appropriately with no excess or shortage. Also, since charge operation circuits having a large current drive capability and a large capacitance value can be used compared with the case of using only one type of charge operation circuits to configure the conversion stages 21, 21, . . . , the charge operation circuits can be placed efficiently in each of the conversion stages 21, 21, . . . , and resultantly the circuit area of each of the conversion stages 21, 21, . . . can be reduced.

Note that in each of the conversion stages 21, 21, . . . shown in FIG. 12, the analog-to-digital conversion circuit 101 and the digital-to-analog conversion circuit 102 may have parallel arrangement as shown in FIGS. 10 and 11.

Other Embodiments

The pipelined AD converters of the above embodiments are applicable to analog signal processing systems such as a video system and a radio system.

Figure 14:
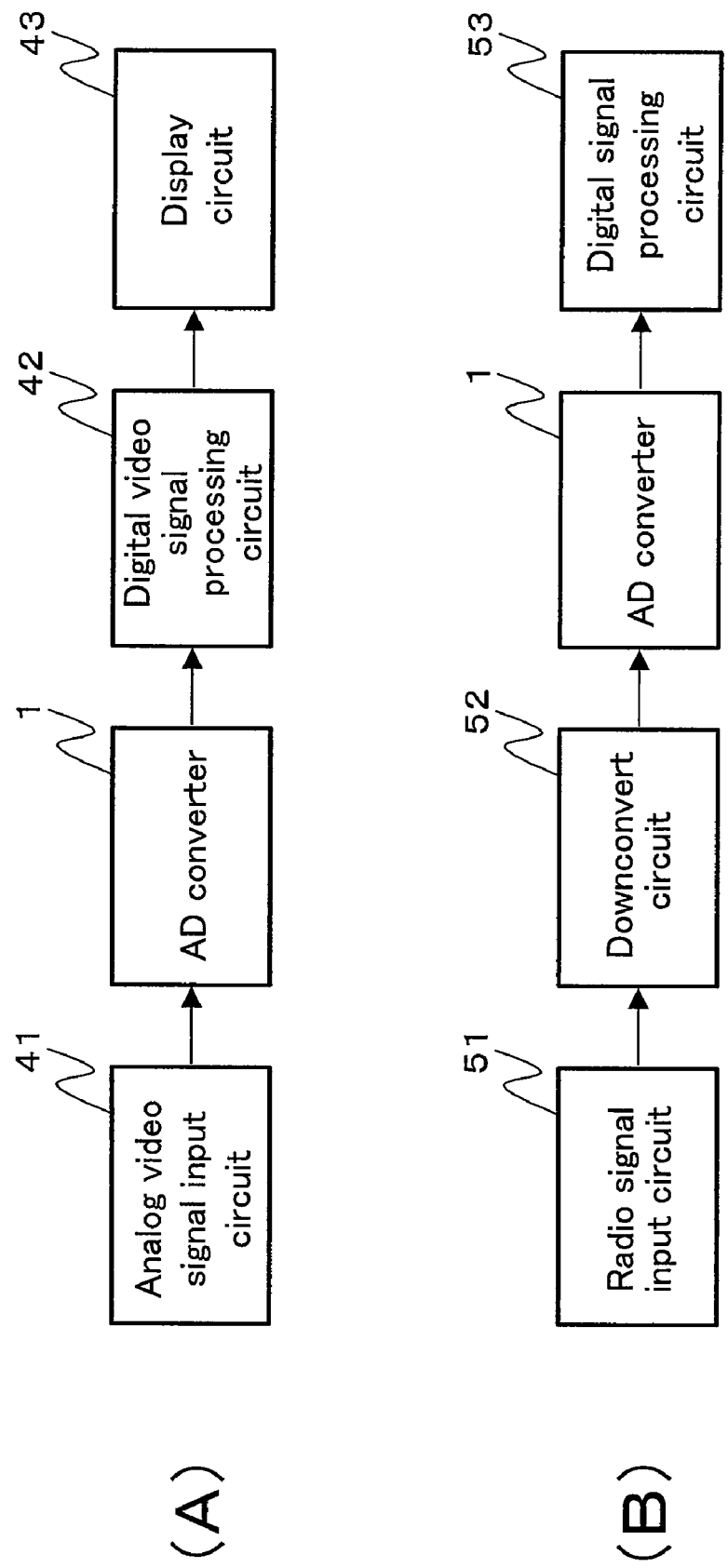
FIG. 14A is a view for illustrating a video system equipped with a pipelined AD converter of the present invention.
FIG. 14B is a view for illustrating a radio system equipped with a pipelined AD converter of the present invention

As shown in FIG. 14A, the pipelined AD converters of the above embodiments are applicable to a video system for processing an analog video signal. In FIG. 14A, an analog video signal input circuit 41 receives an analog video signal (e.g., an imaging signal, a TV broadcasting signal, etc.). The pipelined AD converter 1 converts the analog video signal received by the analog video signal input circuit 41 to a digital video signal. A digital video signal processing circuit 42 executes various types of video signal processing such as YC separation for the digital video signal obtained by the pipelined AD converter 1. A display circuit 43 receives the digital video signal processed by the digital video signal processing circuit 42 and displays an image represented by the digital video signal.

Also, as shown in FIG. 14B, the pipelined AD converters of the above embodiments are applicable to a radio system for extracting a digital signal from a radio signal. In FIG. 14B, a radio signal input circuit 51, which is an antenna, for example, receives a radio signal. A downconvert circuit 52 (analog signal extraction circuit) downconverts the radio signal received by the radio signal input circuit 51 to extract an analog signal from the radio signal. The pipelined AD converter 1 converts the analog signal extracted by the downconvert circuit 52 to a digital signal. A digital signal processing circuit 53 processes the digital signal obtained by the pipelined AD converter 1.

As described above, by applying the pipelined AD converters of the above embodiments to analog signal processing systems such as the video system and the radio system, the number of man-hours for design of the entire system can be reduced. Also, in the case of executing digital correction by intermittently stopping the operation of the system, the time during which the entire system is stopped for measurement of a gain error is shortened, and hence the operation of the system can be smoothly executed. Also, in the case of executing digital correction in parallel with the operation of the system, the memory region for storing data required for digital correction (ideal data, etc.) can be made smaller than that conventionally required. Moreover, since the linearity of the input/output characteristic of the pipelined AD converter can be improved with digital correction techniques, the performance of the system can be enhanced, and the design margin can be increased.

Although the single op-amps are used as an example in the above embodiments, differential op-amps can also be used to yield effects as described above. Also, the analog-to-digital conversion circuit 101 included in each of the conversion stages may be of a multiple-bit conversion type, not limited to the 1-bit conversion type.

INDUSTRIAL APPLICABILITY

As described above, the pipelined AD converter of the present invention, in which layout design and measurement of gain errors can be easily done, is widely applicable to the signal processing field. In particular, the inventive pipelined AD converter is usable in the video and radio fields in which pipelined AD converters are originally strong.

The invention claimed is:

1. A pipelined AD converter comprising:
a plurality of cascaded conversion stages,
wherein each of the plurality of conversion stages includes:
an analog-to-digital conversion circuit for converting an input voltage from the preceding stage to a digital code;
a digital-to-analog conversion circuit for converting the digital code obtained by the analog-to-digital conversion circuit to an intermediate voltage; and
a charge operation circuit having: a capacitor section for sampling the input voltage; and an amplifier section for amplifying a mixed voltage of the input voltage sampled by the capacitor section and the intermediate voltage obtained by the digital-to-analog conversion circuit, and
the amplifier section includes a plurality of op-amps having a same configuration and connected in parallel with each other.

2. The pipelined AD converter of claim 1, wherein in each of the plurality of conversion stages, as the capacitance value of the capacitor section of the conversion stage is greater, the number of op-amps included in the conversion stage is greater.

3. The pipelined AD converter of claim 2, wherein in each of the plurality of conversion stages, as the conversion stage is closer to the first conversion stage, the capacitance value of the capacitor section of the conversion stage is greater, and the number of op-amps included in the conversion stage is greater.

4. The pipelined AD converter of claim 3, wherein the plurality of op-amps included in the plurality of conversion stages have a same current drive capability.

5. The pipelined AD converter of claim 3, wherein the plurality of op-amps included in the plurality of conversion stages each have one of two or more different current drive capabilities.

6. The pipelined AD converter of claim 1, further comprising:
a sample/hold stage connected to the first conversion stage,
wherein the sample/hold stage includes:
a capacitor circuit for sampling an external voltage; and
a transfer circuit for transferring the voltage sampled by the capacitor circuit to the first conversion stage, and
the transfer circuit includes a plurality of op-amps having a same configuration and connected in parallel with each other.

7. The pipelined AD converter of claim 1, further comprising:
a digital correction circuit for correcting digital data including digital codes obtained by the analog-to-digital conversion circuits included in the plurality of conversion stages based on a gain error in at least one conversion stage among the plurality of conversion stages.

8. A video system comprising:
an analog video signal input circuit for receiving an analog video signal;
the pipelined AD converter of claim 1 for converting the analog video signal received by the analog video signal input circuit to a digital video signal; and
a digital video signal processing circuit for processing the digital video signal obtained by the pipelined AD converter.

9. A radio system comprising:
a radio signal input circuit for receiving a radio signal;
an analog signal extraction circuit for extracting an analog signal from the radio signal received by the radio signal input circuit;
the pipelined AD converter of claim 1 for converting the analog signal obtained by the analog signal extraction circuit to a digital signal; and
a digital signal processing circuit for processing the digital signal obtained by the pipelined AD converter.

10. A pipelined AD converter comprising:
a plurality of cascaded conversion stages,
wherein each of the plurality of conversion stages includes:
an analog-to-digital conversion circuit for converting an input voltage from the preceding stage to a digital code;
a digital-to-analog conversion circuit for converting the digital code obtained by the analog-to-digital conversion circuit to an intermediate voltage; and
a plurality of charge operation circuits connected in parallel with each other, each having: a capacitor section for sampling the input voltage; and an op-amp for amplifying a mixed voltage of the input voltage sampled by the capacitor section and the intermediate voltage obtained by the digital-to-analog conversion circuit, and
the op-amps of the plurality of charge operation circuits have a same configuration, and
the capacitor section of each of the plurality of charge operation circuits has a capacitance value corresponding to the current drive capability of the op-amp of the charge operation circuit.

11. The pipelined AD converter of claim 10, wherein in each of the plurality of conversion stages, as the conversion stage is closer to the first conversion stage, the number of charge operation circuits included in the conversion stage is greater.

12. The pipelined AD converter of claim 11, wherein the op-amps of the plurality of charge operation circuits included in the plurality of conversion stages have a same current drive capability.

13. The pipelined AD converter of claim 11, wherein the op-amps of the plurality of charge operation circuits included in the plurality of conversion stages each have one of two or more different current drive capabilities.

14. The pipelined AD converter of claim 10, wherein the digital-to-analog conversion circuit includes a plurality of digital-to-analog conversion sections corresponding to the plurality of charge operation circuits, each of the digital-to-analog conversion sections converts the digital code obtained by the analog-to-digital conversion circuit to an intermediate voltage, and each of the plurality of charge operation circuits receives the intermediate voltage obtained by the corresponding digital-to-analog conversion section.

15. The pipelined AD converter of claim 14, wherein the analog-to-digital conversion circuit includes a plurality of analog-to-digital conversion sections corresponding to the plurality of digital-to-analog conversion sections, each of the plurality of analog-to-digital conversion sections converts the input voltage to a digital code, and each of the plurality of digital-to-analog conversion sections converts the digital code obtained by the corresponding analog-to-digital conversion section to an intermediate voltage.

16. The pipelined AD converter of claim 10 further comprising:

a sample/hold stage connected to the first conversion stage, wherein the sample/hold stage includes:

a capacitor circuit for sampling an external voltage; and a transfer circuit for transferring the voltage sampled by the capacitor circuit to the first conversion stage, and the transfer circuit includes a plurality of op-amps having a same configuration and connected in parallel with each other.

17. The pipelined AD converter of claim 10, further comprising:

a digital correction circuit for correcting digital data including digital codes obtained by the analog-to-digital conversion circuits included in the plurality of conversion stages based on a gain error in at least one conversion stage among the plurality of conversion stages.

18. A video system comprising:

an analog video signal input circuit for receiving an analog video signal;

the pipelined AD converter of claim 10 for converting the analog video signal received by the analog video signal input circuit to a digital video signal; and a digital video signal processing circuit for processing the digital video signal obtained by the pipelined AD converter.

19. A radio system comprising:

a radio signal input circuit for receiving a radio signal;

an analog signal extraction circuit for extracting an analog signal from the radio signal received by the radio signal input circuit;

the pipelined AD converter of claim 10 for converting the analog signal obtained by the analog signal extraction circuit to a digital signal; and a digital signal processing circuit for processing the digital signal obtained by the pipelined AD converter.

* * * * *